(12) United States Patent
Dak et al.

(10) Patent No.: US 10,984,876 B2
(45) Date of Patent: Apr. 20, 2021

(54) TEMPERATURE BASED PROGRAMMING IN MEMORY

(71) Applicant: SanDisk Technologies LLC, Addison, TX (US)

(72) Inventors: Piyush Dak, San Jose, CA (US); Mohan Dunga, San Jose, CA (US); Chao Qin, San Jose, CA (US); Muhammad Masuduzzaman, San Jose, CA (US); Xiang Yang, San Jose, CA (US)

(73) Assignee: SanDiskTechnologies LLC, Addison, TX (US)

( * ) Notice: Subject to any disclaimer, the term of this patent is extended or adjusted under 35 U.S.C. 154(b) by 14 days.

(21) Appl. No.: 16/445,367

(22) Filed: Jun. 19, 2019

(65) Prior Publication Data
US 2020/0402594 A1  Dec. 24, 2020

(51) Int. Cl.
| G11C 16/34 | (2006.01) |
| G11C 16/32 | (2006.01) |
| G11C 16/26 | (2006.01) |
| G11C 16/10 | (2006.01) |

(52) U.S. Cl.
CPC .............. *G11C 16/32* (2013.01); *G11C 16/10* (2013.01); *G11C 16/26* (2013.01); *G11C 16/3459* (2013.01)

(58) Field of Classification Search
CPC ......... G11C 16/32; G11C 16/10; G11C 16/26; G11C 16/3459
See application file for complete search history.

(56) References Cited

U.S. PATENT DOCUMENTS

| 2002/0085429 A1* | 7/2002 | Kim ...................... G11C 29/12 365/189.09 |
| 2009/0190427 A1 | 7/2009 | Brittain et al. |
| 2010/0023678 A1 | 1/2010 | Nakanishi et al. |
| 2010/0054068 A1 | 3/2010 | Incarnati et al. |
| 2013/0275651 A1* | 10/2013 | D'Abreu ............ G11C 16/3431 711/103 |

(Continued)

OTHER PUBLICATIONS

International Search Report and Written Opinion, PCT/US2019/066461, dated Sep. 7, 2020.

*Primary Examiner* — Jay W. Radke
(74) *Attorney, Agent, or Firm* — Dickinson Wright PLLC; Steven Hurles

(57) ABSTRACT

Various methods include receiving, by a controller, a temperature reading of a memory array, the temperature reading includes a temperature value; determining the temperature value is below a first threshold; in response, modifying a duration of a verify cycle of a write operation to create a modified verify cycle; then programming a first data into the memory array using the write operation that uses the modified verify cycle. Methods additionally include receiving a second temperature reading of the memory array, the second temperature reading includes a second temperature value; determining the second temperature value is below a second threshold, in response, decreasing the duration of a verify cycle of a verify cycle to create a second verify cycle, where the second verify cycle is shorter than the modified verify cycle; and then programming a second data into the memory array using the write operation that uses the second verify cycle.

19 Claims, 11 Drawing Sheets

(56) References Cited

U.S. PATENT DOCUMENTS

2014/0201550 A1   7/2014  Rusu
2016/0239235 A1*  8/2016  Chung ............... G11C 16/0483
2017/0124007 A1   5/2017  Zehavi et al.

* cited by examiner

• FOR LT, NVT IS HIGHER HENCE THE HIGHER # OF VERIFIES

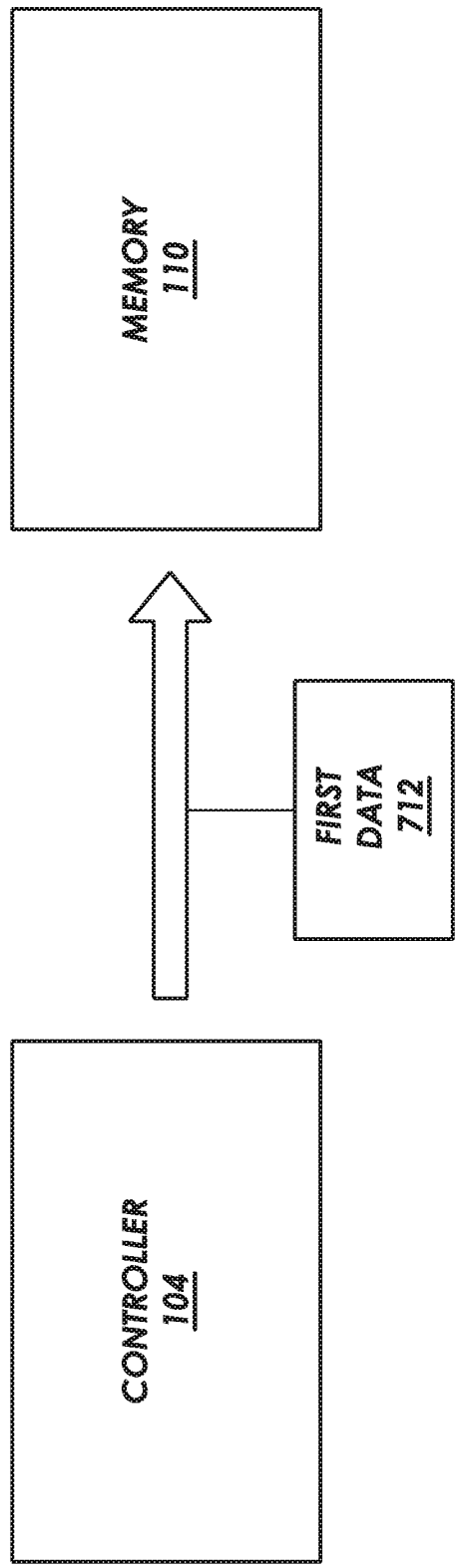

US 10,984,876 B2

TEMPERATURE BASED PROGRAMMING IN MEMORY

BACKGROUND

Non-volatile memory systems retain stored information without requiring an external power source. One type of non-volatile memory that is used ubiquitously throughout various computing devices and in stand-alone memory devices is flash memory. For example, flash memory can be found in a laptop, a digital audio player, a digital camera, a smart phone, a video game, a scientific instrument, an industrial robot, medical electronics, a solid state drive, and a USB drive.

Various factors and parameters can impact performance of the flash memory. One of the factors used to measure the performance of the flash memory includes the speed of reading or writing to the flash memory. Writing data into flash memory can involve several programming and verify cycles, while reading data can include read cycles and various error correction codes to recover faulty data. A programming cycle can include one or more programming pulses defining a pulse width and height, while a verify cycle also includes one or more different pulses corresponding to different read levels. A verify cycle reads data to verify correctness of a programming cycle.

SUMMARY

Various embodiments include a storage system, configured to modify clock parameters during a write operation, including: the memory array; and a controller coupled to the memory array, where the controller is configured to: receive a temperature reading of the memory array, the temperature reading includes a temperature value; determine the temperature value is below a first threshold; in response, decrease a clock timing to a lower temperature timing, the clock timing associated with a write operation of the memory array; and then program a first data into the memory array using the write operation that uses the lower temperature timing.

Other embodiments include a memory controller, including: a first terminal configured to couple to a memory array, the memory controller configured to: receive a temperature reading of the memory array, the temperature reading includes a temperature value; determine the temperature value is below a first threshold; in response, decrease a clock timing to a lower temperature timing, the clock timing associated with a write operation of the memory array; and then program a first data into the memory array using the write operation that uses the lower temperature timing.

Other embodiments include a method for dynamically adjusting clock parameters during a write operation, including: receiving, by a controller, a temperature reading of a memory array, the temperature reading includes a temperature value; determining the temperature value is below a first threshold; in response, modifying a duration of a verify cycle of a write operation to create a modified verify cycle; and then programming a first data into the memory array using the write operation that uses the modified verify cycle.

BRIEF DESCRIPTION OF THE DRAWINGS

For a detailed description of example embodiments, reference will now be made to the accompanying drawings in which:

FIG. 7C illustrates a conceptual and method diagram in which the controller performs a programming cycles based on a temperature reading, in accordance with some embodiments.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various terms are used to refer to particular system components. Different companies may refer to a component by different names—this document does not intend to distinguish between components that differ in name but not function. That is, the use of a named component is not meant to be limiting as to that particular component; rather, any use of any named component herein describes and would read on any embodiment capable of or configured to perform the function of the named component. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. References to a controller shall mean individual circuit components, an application-specific integrated circuit (ASIC), a microcontroller with controlling software, a digital signal processor (DSP), a processor with controlling software, a field programmable gate array (FPGA), or combinations thereof.

At least some of the example embodiments are directed to dynamically adjusting clock parameters during a write operation. As described herein, a resistance of a word line varies with temperature. For example, as temperature decreases, the resistance of the word line decreases. The decreased resistance of the word line also results in less time needed for voltages to settle during a write operation. That is, the word lines reach a target voltage sooner. Methods described herein leverage the phenomenon described above to modify the duration of a write operation when a memory is operating at lower temperatures.

Figure 1:
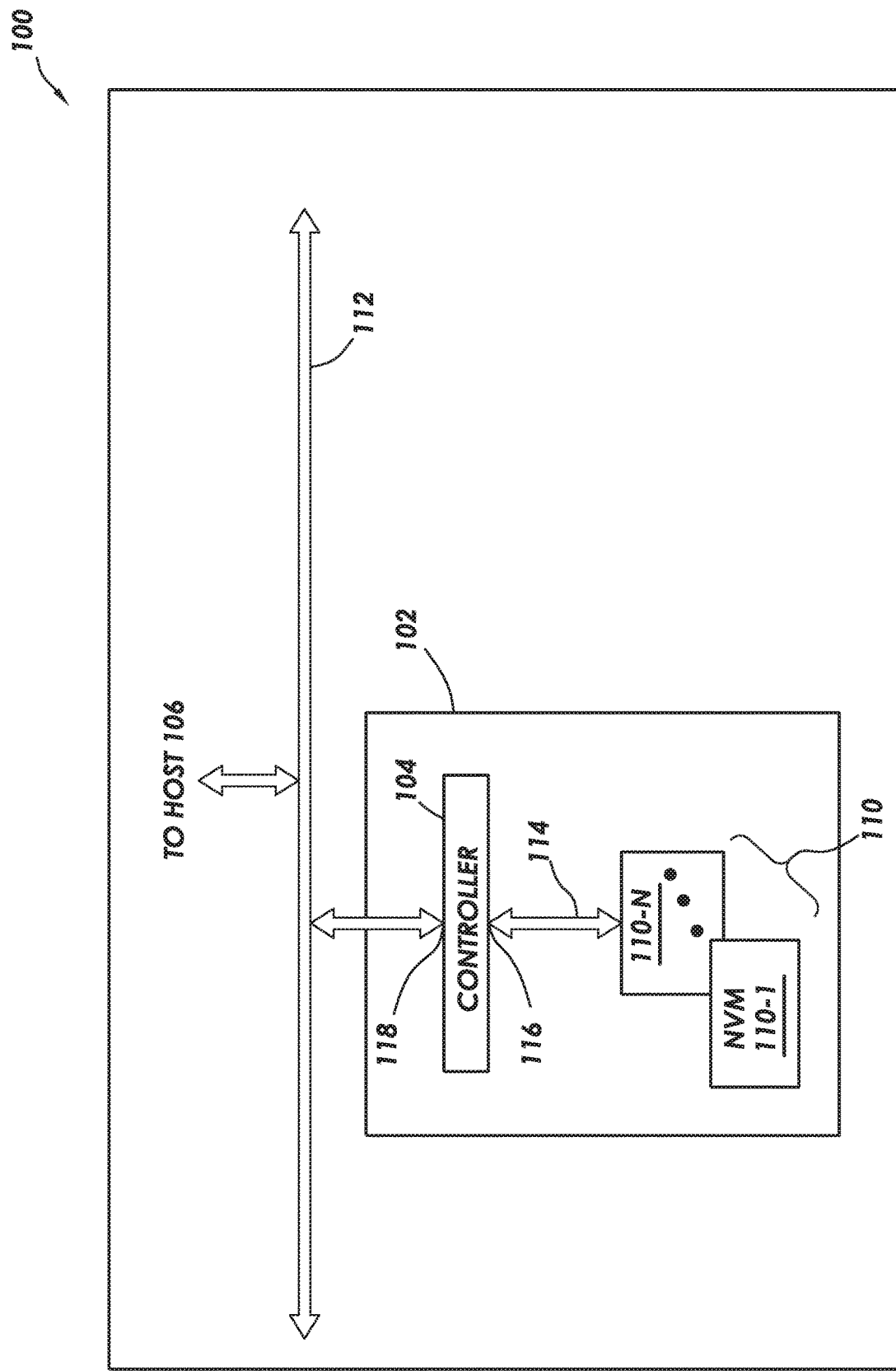
FIG. 1 illustrates a block diagram of an example non-volatile memory system, in accordance with some embodiments.

FIG. 1 illustrates a block diagram of an example system architecture 100 including non-volatile memory 110. The example system architecture 100 includes storage system 102, a controller 104 communicatively coupled to a host 106 by a bus 112. The bus 112 implements any known or after developed communication protocol that enables the storage system 102 and the host 106 to communicate. Some non-limiting examples of a communication protocol include Secure Digital (SD) protocol, Memory Stick (MS) protocol, Universal Serial Bus (USB) protocol, or Advanced Microcontroller Bus Architecture (AMBA).

The controller 104 has at least a first port 116 coupled to a non-volatile memory ("NVM") 110, hereinafter "memory 110" by way of a communication interface 114. The memory 110 is disposed within the storage system 102. The controller 104 couples the host 106 by way of a second port 118 and the bus 112. The first and second ports 116 and 118 of the controller can include one or several channels that couple the memory 110 or the host 106, respectively.

The memory 110 of the storage system 102 includes several memory die 110-1-110-N. The manner in which the memory 110 is defined in FIG. 1 is not meant to be limiting. In some embodiments, the memory 110 defines a physical set of memory die, such as the memory die 110-1-110-N. In other embodiments, the memory 110 defines a logical set of memory die, where the memory 110 includes memory die from several physically different sets of memory die. The memory die 110 include non-volatile memory cells that retain data even when there is a disruption in the power supply. Thus, the storage system 102 can be easily transported and the storage system 102 can be used in memory cards and other memory devices that are not always connected to a power supply.

In various embodiments, the memory cells in the memory die 110 are solid-state memory cells (e.g., flash), one-time programmable, few-time programmable, or many time programmable. Additionally, the memory cells in the memory die 110 can include single-level cells (SLC), multiple-level cells (MLC), or triple-level cells (TLC). In some embodiments, the memory cells are fabricated in a planar manner (e.g., 2D NAND (NOT-AND) flash) or in a stacked or layered manner (e.g., 3D NAND flash).

Still referring to FIG. 1, the controller 104 and the memory 110 are communicatively coupled by an interface 114 implemented by several channels (e.g., physical connections) disposed between the controller 104 and the individual memory die 110-1-110-N. The depiction of a single interface 114 is not meant to be limiting as one or more interfaces can be used to communicatively couple the same components. The number of channels over which the interface 114 is established varies based on the capabilities of the controller 104. Additionally, a single channel can be configured to communicatively couple more than one memory die. Thus the first port 116 can couple one or several channels implementing the interface 114. The interface 114 implements any known or after developed communication protocol. In embodiments where the storage system 102 is flash memory, the interface 114 is a flash interface, such as Toggle Mode 200, 400, or 800, or Common Flash Memory Interface (CFI).

In various embodiments, the host 106 includes any device or system that utilizes the storage system 102—e.g., a computing device, a memory card, a flash drive. In some example embodiments, the storage system 102 is embedded within the host 106—e.g., a solid state disk (SSD) drive installed in a laptop computer. In additional embodiments, the system architecture 100 is embedded within the host 106 such that the host 106 and the storage system 102 including the controller 104 are formed on a single integrated circuit chip. In embodiments where the system architecture 100 is implemented within a memory card, the host 106 can include a built-in receptacle or adapters for one or more types of memory cards or flash drives (e.g., a universal serial bus (USB) port, or a memory card slot).

Although, the storage system 102 includes its own memory controller and drivers (e.g., controller 104)—as will be described further below in FIG. 2A—the example described in FIG. 1 is not meant to be limiting. Other embodiments of the storage system 102 include memory-only units that are instead controlled by software executed by a controller on the host 106 (e.g., a processor of a computing device controls—including error handling of—the storage unit 102). Additionally, any method described herein as being performed by the controller 104 can also be performed by the controller of the host 106.

In various embodiments, the controller 104 serves as an interface between the host 106 and the storage system 102 and manages data stored on the storage system 102. The controller 104 can include individual circuit components, processing circuitry (e.g., logic gates and switches), a processor, a microprocessor, a microcontroller with controlling software, or a field programmable gate array (FPGA). The example controller 104 can include a computer-readable medium that stores computer-readable program code (e.g., software or firmware) executable by a processor. In some embodiments, the controller 104 is a flash memory controller. In other embodiments, the functionality of the controller 104 is implemented by a processor executing within the host 106.

Still referring to FIG. 1, the host 106 includes its own controller (e.g., a processor) configured to execute instructions stored in the storage system 102 and further the host 106 accesses data stored in the storage system 102, referred to herein as "host data". The host data includes data originating from and pertaining to applications executing on the host 106. In one example, the host 106 accesses host data stored in the storage system 102 by providing a logical address to the controller 104 which the controller 104 converts to a physical address. The controller 104 accesses the data or particular storage location associated with the physical address and facilitates transferring data between the storage system 102 and the host 106. In embodiments where the storage system 102 includes flash memory, the controller 104 formats the flash memory to ensure the memory is operating properly, maps out bad flash memory cells, and allocates spare cells to be substituted for future failed cells or used to hold firmware to operate the flash memory controller (e.g., the controller 104). Thus, the controller 104 performs various memory management functions such as wear leveling (e.g., distributing writes to extend the lifetime of the memory blocks), garbage collection (e.g., moving valid pages of data to a new block and erasing the previously used block), and error detection and correction (e.g., read error handling, modified XOR operations).

Additional details of the controller 104 and the memory 110 are described next in FIGS. 2A and 2B. Specifically, FIG. 2A shows, in block diagram form, additional details with respect to the controller 104 (introduced in FIG. 1) of the storage system 102. FIG. 2A illustrates previously described controller 104, memory 110 and ports 116 and 118. Additionally, the storage system 102 includes a random access memory (RAM) 230, a read only memory (ROM) 232 respectively coupled to the controller 104 by a RAM port 272 and a ROM port 274.

Although the RAM 230 and the ROM 232 are shown as separate modules within the storage system 102, the illustrated architecture is not meant to be limiting. For example, the RAM 230 and the ROM 232 can be located within the controller 104. In other cases, portions of the RAM 230 or ROM 232, respectively, can be located outside the controller 104. In other embodiments, the controller 104, the RAM 230, and the ROM 232 are located on separate semiconductor die. The discussion now turns to the various example modules included within the controller 104.

The following discussion of the various modules depicted within the controller 104 are meant to be illustrative and not limiting as to the architecture of the controller 104. For example, the various modules described in FIG. 2A are not limited to being executed within the controller 104; one or more modules can be executed outside the controller 104. The various modules can be combined within the controller and can include optional modules implemented within the controller. As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combinations thereof. In other embodiments, a module can include memory that stores instructions executable by a controller to implement a feature of the module. Thus, the controller can be configured with hardware and/or firmware to perform the various functions described herein.

The modules within the controller (e.g., modules 202, 204, 276, and 236) are communicatively coupled to each other by a bus 206. The module 202 interfaces with the host 106 and includes a host interface 208 and a physical layer interface 210 that provides the electrical interface between the host 106 or next level storage controller and the controller 104. The host interface 208 facilitates transfer of data, control signals, and timing signals. Examples of the host interface 208 include SATA, SATA express, Serial Attached SCSI (SAS), Fiber Channel, USB, PCIe, and NVMe.

Figure 2A:
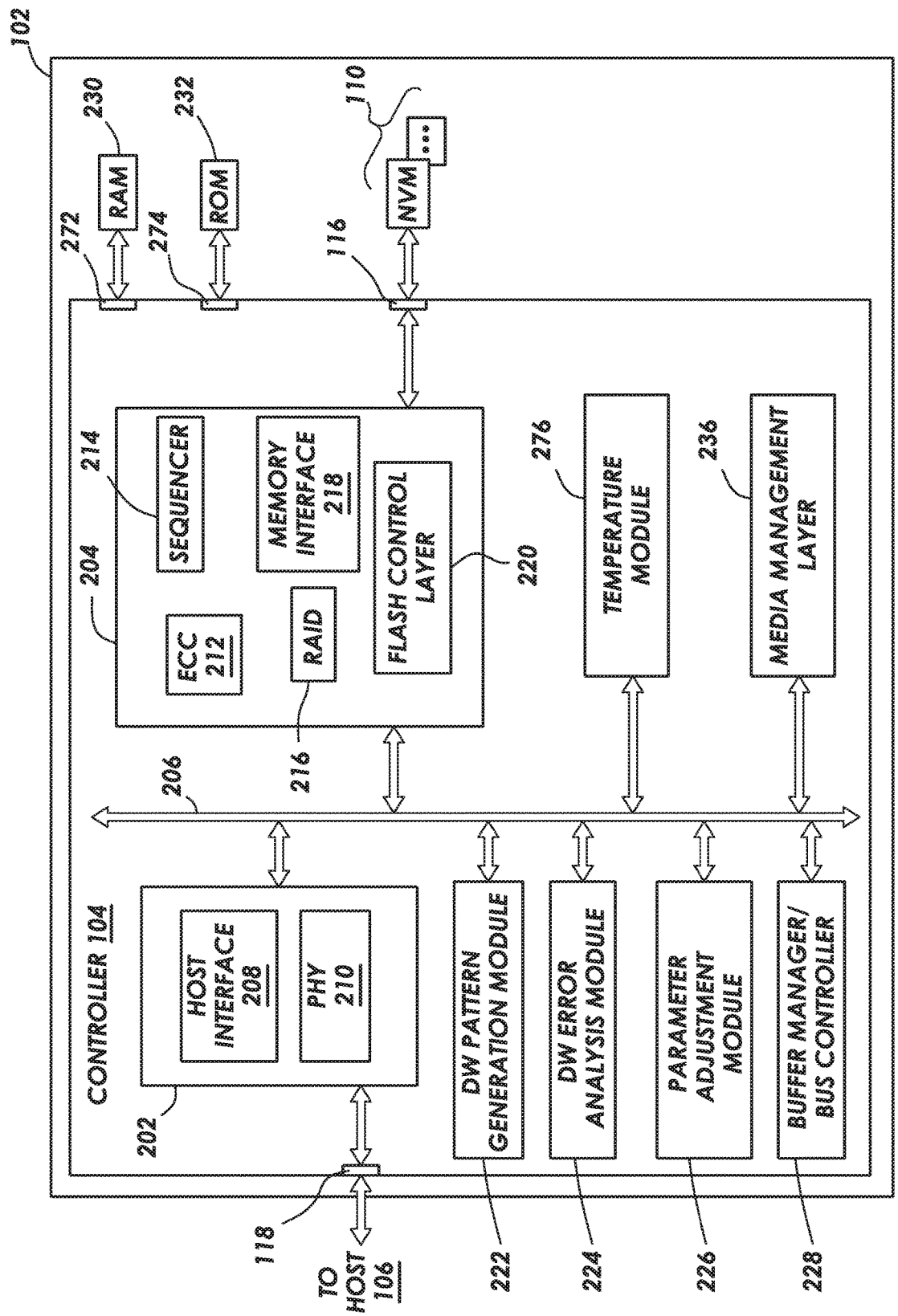
FIG. 2A illustrates a block diagram of example components of a controller, in accordance with some embodiments.

Still referring to FIG. 2A, the module 204 is configured to communicate with the memory 110, by way of port 116, and includes an error correcting code (ECC) engine 212, a sequencer 214, a Redundant Array of Independent Drives (RAID) module 216, a flash control layer 220, and a memory interface 218. In some embodiments, the ECC engine 212 encodes host data received from the host 106 and stores the encoded host data in the memory 110. When the host data is read out from the memory 110, the ECC engine 212 decodes the host data and corrects errors detected within the host data. In various embodiments, the sequencer 214 generates command sequences, such as program and erase command sequences that are transmitted to the memory 110.

The RAID module 216 generates RAID parity and recovery of failed data. The RAID parity can be used to provide an additional level of integrity protection for data written into the memory 110. In some embodiments, the ECC engine 212 implements the functions of the RAID module 216.

The memory interface 218 provides command sequences to the memory 110 and receives status information from the memory 110. For example, the memory interface 218 implements any known or after developed communication protocol including a double data rate (DDR) interface, such as a Toggle Mode 200, 400, or 800 interface. The flash control layer 220 controls the overall operation of the module 204.

Still referring to FIG. 2A, additional modules within the controller 104 include a dummy word line (DW) pattern generation module 222, a DW error analysis module 224, a parameter adjustment module 226, and a temperature module 276. In various embodiments, the DW pattern generation module 222 puts a known data pattern into a dummy word line and tracks or periodically checks for errors by reading the data back out of the dummy word line and comparing the data to the known data pattern.

In various embodiments, the parameter adjustment module 226 adjusts parameters associated with a particular non-volatile memory die or more specifically a particular memory block including, erase, program, and read parameters. In accordance with methods described herein, during a write operation, the parameter adjustment module 226 modifies clock timing parameters associated with a respective block, based on a temperature reading of the memory 110.

In various embodiments, the temperature reading is provided by the temperature module 276. The temperature module 276 receives a temperature reading from a temperature sensor disposed on the memory 110. In one example, a temperature reading includes at least one selected from the group including: a temperature value, a time stamp, a memory location, and a sensor identification. The temperature value reflects a temperature of the memory 110 at the time of a particular read. The time stamp reflect the time the data for the temperature reading was obtained. The memory location includes a location in the memory 110 where the temperature reading was taken. The sensor identification includes an identifier associated with a sensor performing the temperature reading. In some examples, data about the location of the temperature read is inferred from the sensor identification, based on a location of the sensor. As described, herein, the controller 104 adjusts various parameters associated with a write operation based on a given temperature value.

The example controller 104 includes a buffer manager/bus controller 228 that manages, for example, buffers in the RAM 230 and controls the internal bus arbitration of the bus 206 in the controller 104. Additionally, the example controller 104 includes a media management layer 236 that performs wear leveling of the memory 110. In embodiments where the storage system 102 includes flash memory, the media management layer 236 can be integrated as part of the flash management that handles flash error and interfaces with the host 106. In particular, the media management layer 236 can include an algorithm (e.g., firmware in the memory device), that translates a write command received from the host 106 into a write to the memory 110. Accordingly, modules and components within an example controller 104 have been described.

Figure 2B:
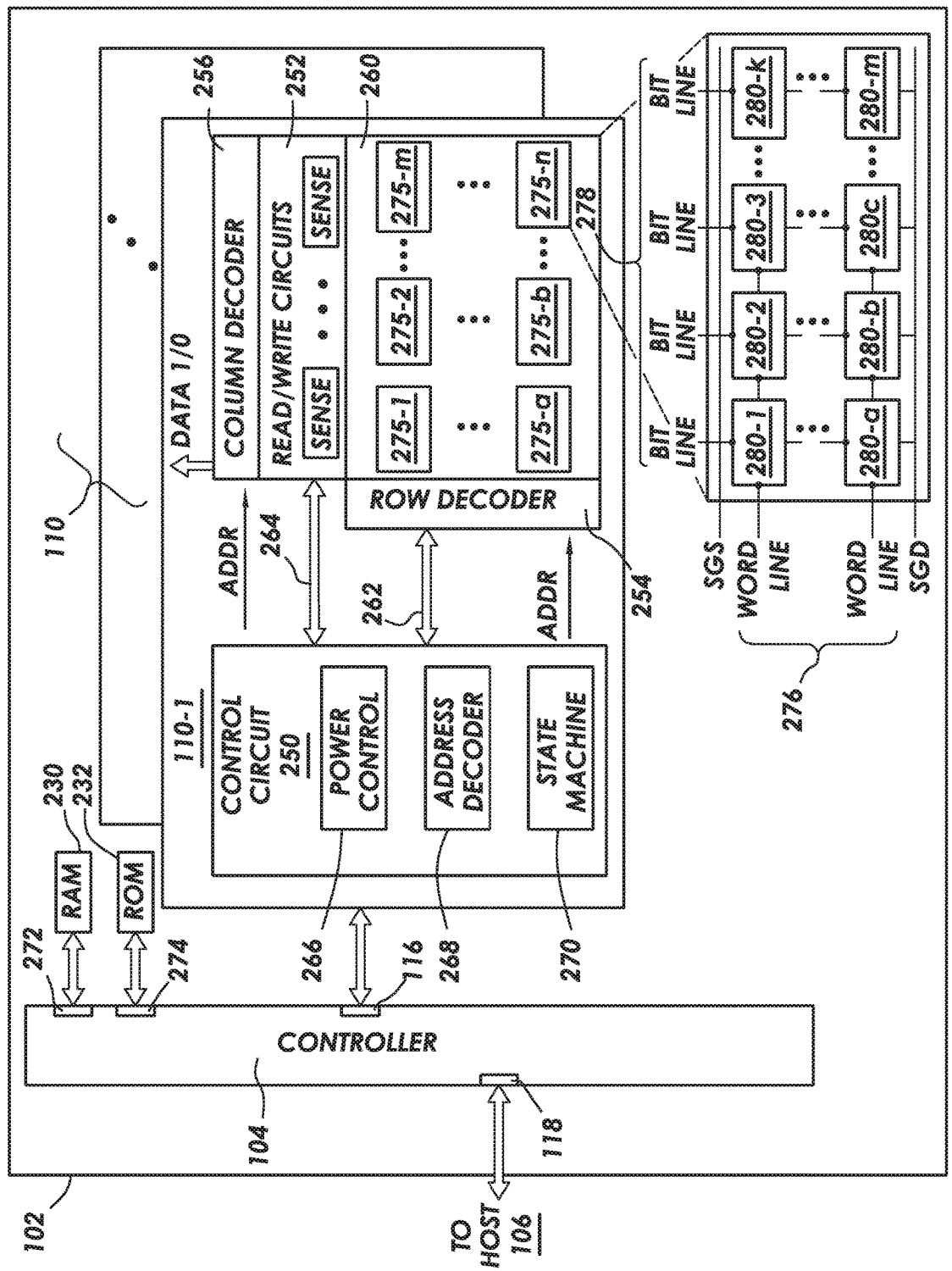
FIG. 2B illustrates a block diagram of example components of a non-volatile memory storage system, in accordance with some embodiments.

FIG. 2B shows in block diagram form, various features and an example layout of the memory 110 within the storage system 102. In order to orient the reader, previously described controller 104, RAM 230, and the ROM 232, are included in FIG. 2B. Although the discussion in FIG. 2B centers on the memory die 110-1, each of the features discussed in relation to the memory die 110-1 equally applies to all the memory die within the memory 110.

In various embodiments, the example memory die 110-1 includes control circuit 250, read/write circuits 252, a row decoder 254, a column decoder 256, and a memory array 260. The example control circuit 250 includes a power control circuit 266, an address decoder 268, and a state machine 270 (collectively referred to herein as "managing circuits"). The control circuit 250 and its various managing circuits, are communicatively coupled by various interfaces (e.g., interfaces 262 and 264) to the row decoder 254 and the column decoder 256. In various embodiments, the control circuit 250 performs various operations on the memory array 260 that include reading (e.g. through a read operation) or writing (e.g., through a program or write operation) to the memory cells by way of the row decoder 254 and the column decoder 256. In some embodiments, the read/write circuits 252 are configured to read and program pages of memory within the memory die 110-1 in parallel.

The power control circuit 266 controls the power and voltage supplied to the word lines and bit lines during operation of the memory array 260. The address decoder 268 provides an address interface that translates addresses between addresses provided by the host 106 and addresses used by the row decoder 254 and the column decoder 256 and vice versa. The state machine 270 provides chip-level control of memory operations.

The architecture of the memory die 110-1 is not meant to be limiting and any known architecture that can perform the functions of accessing the memory array 260 can be used without departing from the scope of this disclosure. For example, in various embodiments, access to the memory array 260 by various peripheral circuits can be implemented in a symmetric fashion on opposite sides of the memory array 260 which reduces the densities of access lines and circuitry on each side of the memory array 260.

Still referring to FIG. 2B, the example memory array 260 includes several memory blocks 275, arranged as a two-dimensional array. For sake of example, the memory block 275-n is further detailed using dashed lines. The example memory block 275-n includes a two-dimensional array of memory cells 280, arranged in an array of rows and columns. Respective columns of memory cells 280 are coupled to respective bit lines 278, and respective rows of memory cells 280 are coupled to a respective word line 276. Additionally, each of the columns of memory cells 280 is coupled to a select gate drain (SGD) and a select gate source (SGS) lines.

Figure 3:
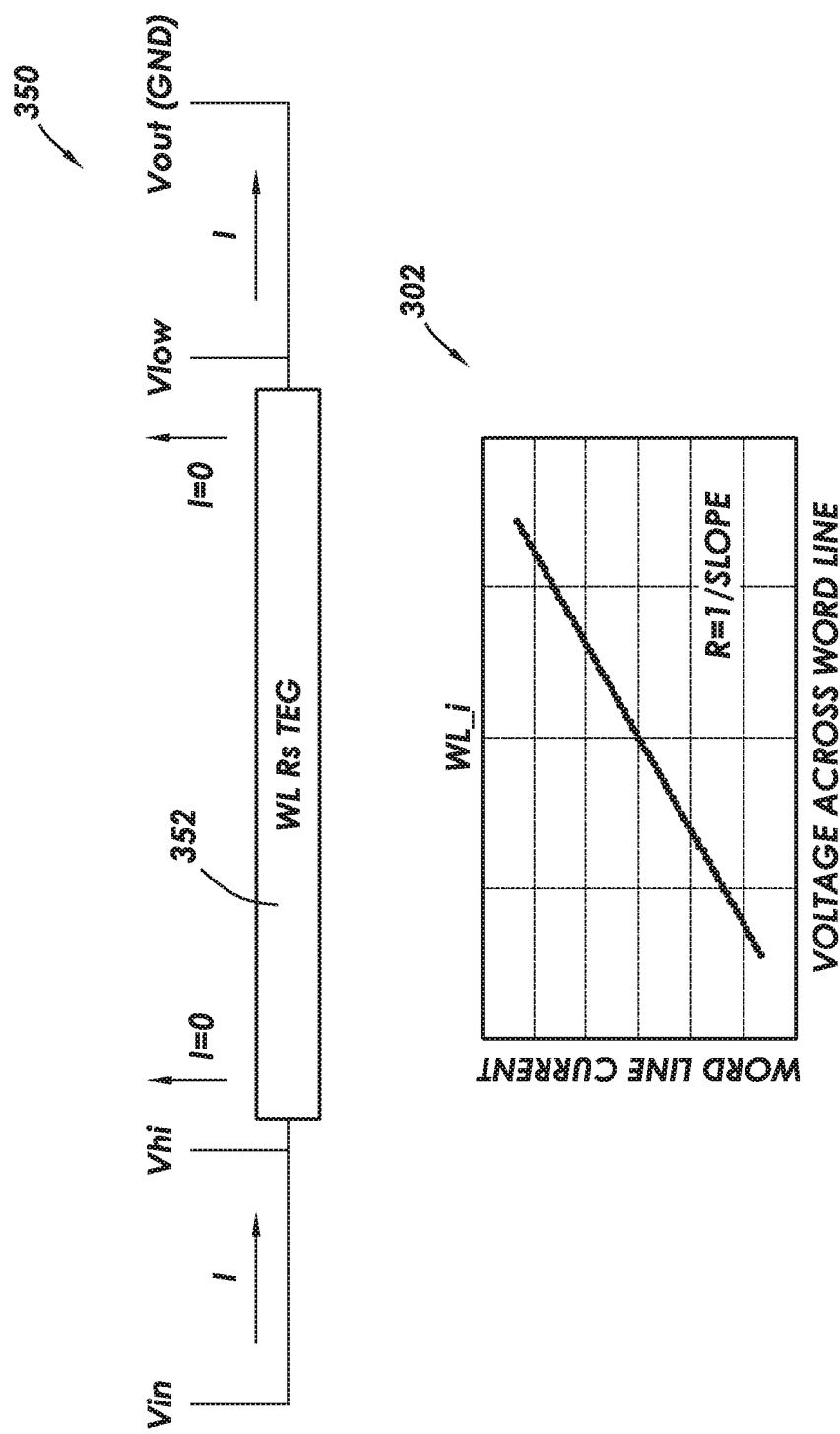
FIG. 3 illustrates a block diagram and method of measuring resistance, in accordance with some embodiments.

In various embodiments, when a data is read from or written to the memory 110, a resistance of the word line impacts the speed of the operation. FIG. 3 illustrates a Kelvin structure 352 and describes a method of measuring resistance of a word line. As used herein, resistance of a word line is calculated by:

$$\text{Resistance (sheet)} = \frac{\frac{Vhi - Vlow}{I}}{\# \text{ of sheets}} \quad (1)$$

wherein Vhi, defines a voltage potential at a first end of the Kelvin structure 352 and Vlow defines a voltage potential at a second end of the Kelvin structure 352. The first end of the Kelvin structure 352 is coupled to a voltage source Vin defining a voltage sweep (e.g., voltage ranging between +1V and −1V). The second end of the Kelvin structure 352 is coupled to a Vout coupled to a ground.

The plot 302 illustrates an example sheet resistance of the Kelvin structure 352, measured using the above described method of measuring a resistance of a word line. Plot 302 defines voltage values along the x-axis, and current (e.g., in amperes) along the y-axis.

Figure 4:
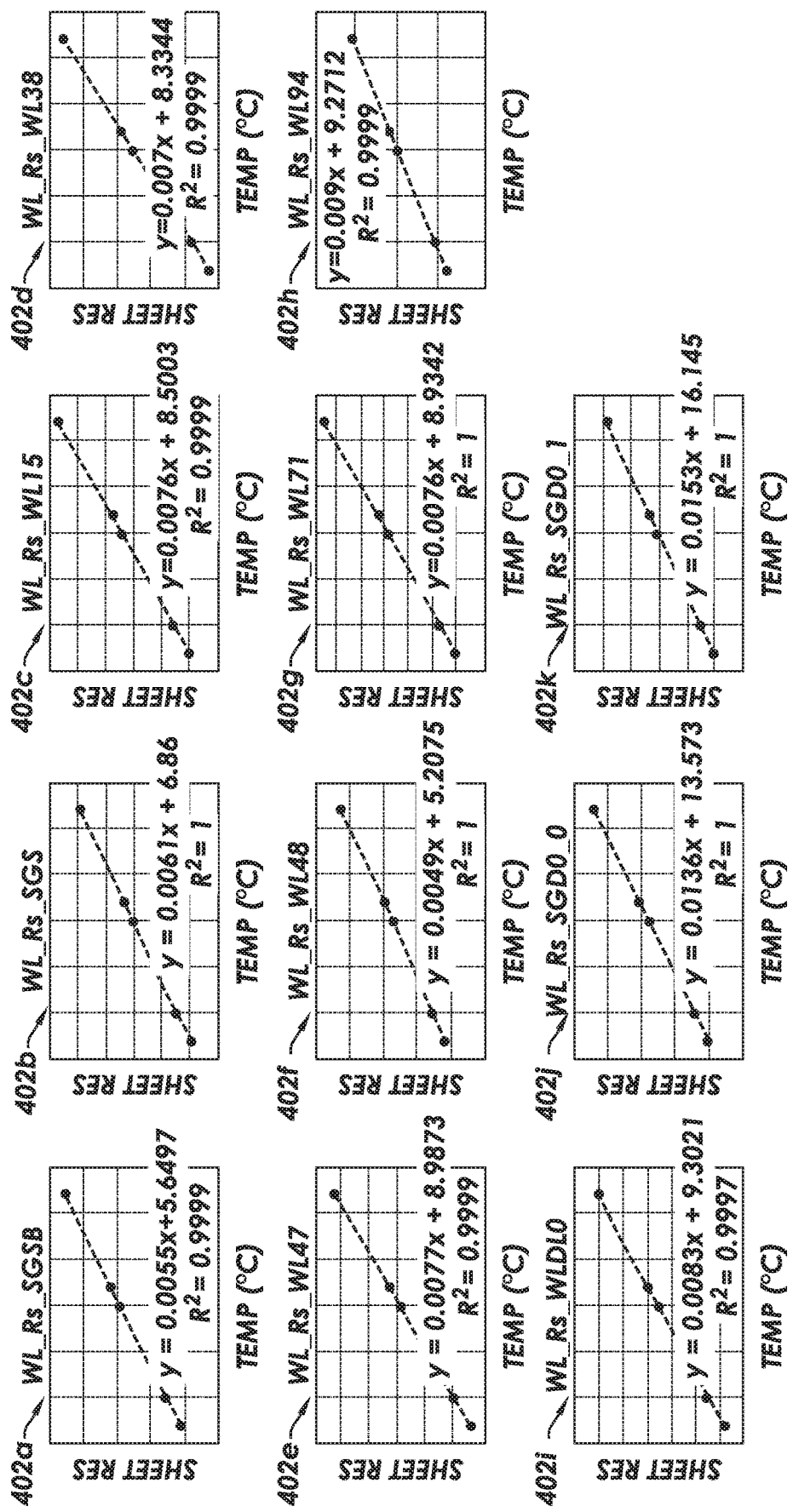
FIG. 4 illustrates plots demonstrating a relationship between resistance and temperature, in accordance with some embodiments.

FIG. 4 illustrates several plots 402 demonstrating a relationship between resistance (e.g., sheet resistance) and temperature of various word lines in a memory array (e.g., memory array 260). Example Plot 402a defines temperatures along the x-axis, and resistance values along the y-axis. Each of the plots 402 illustrates the correlation between resistance values and temperatures for individual word lines in the memory 110. For example, the plot 402a illustrates resistance values (e.g., sheet resistance) of a select gate word line (SGSB) for given temperatures, the example plot 402c illustrates resistance values of a data word line (WL15) for given temperatures, the example plot 402e illustrates resistance values of data word line (WL47) for given temperatures, etc. The several plots 402 illustrate that for any given word line, as temperature decreases, the resistance of the respective word line decreases.

The methods described herein—related to performing a write operation—leverage the described relationship between temperature and resistance of a word line to dynamically set parameters of a write operation. In particular, when a memory operates at lower temperatures, timing parameters associated with a verify cycle of the write operation are shortened. During a write operation, several programming and verify cycles may be used to program a memory cell. As used herein, a write operation includes a programming cycle followed by a verify cycle.

Figure 5A:
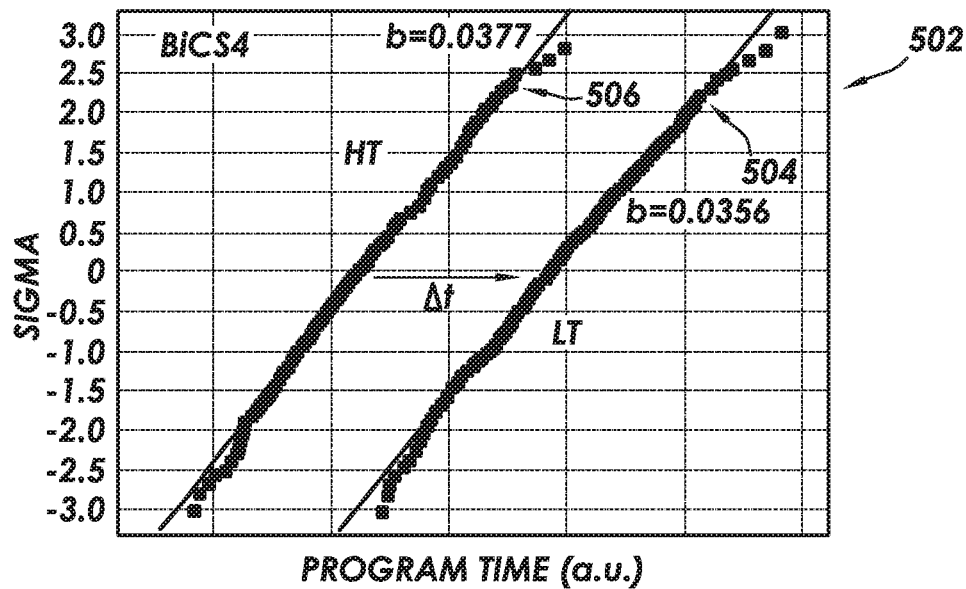
FIG. 5A illustrates a distribution plot, in accordance with some embodiments.
Figure 5B:
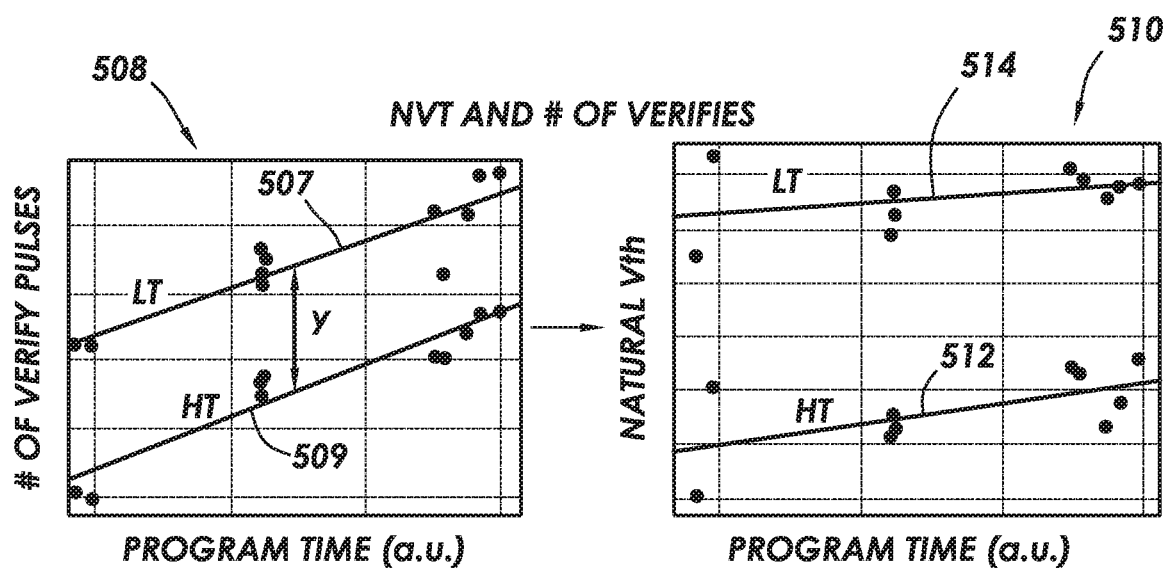
FIG. 5B illustrates distribution plots, in accordance with some embodiments.

FIG. 5A illustrates a distribution plot 502. The distribution plot 502 defines time (in microseconds) to perform a write operation along the x-axis and a sigma value associated with the distribution along the y-axis. FIG. 5B illustrates additional distribution plots 508 and 510 associated with the plot 502. The distribution plots 508 and 510 define time (in microseconds) along each of the respective x-axes. A number of verify cycles is shown along the y-axis of plot 508, and a 5 sigma value associated with the natural threshold voltages of the memory cell is shown along the y-axis of plot 510. Each of the plots 502, 508, and 510 illustrate data corresponding to programming memory cells at higher and lower temperatures.

In one example, a write operation includes a programming cycle that further includes one or more programming pulses successively applied prior to a verify cycle. A programming pulse defines a pulse height, a pulse width, and a rise and fall time. As used herein, the pulse height is defined by an amount of voltage, the pulse width defines a duration of the pulse, while the rise and fall time define a voltage ramp rate.

The verify cycle includes one or more verify pulses corresponding to different voltage levels of a respective word line. In one example embodiment, a verify pulse can include one or more stages including a first stage during which a voltage on a word line ramps up and decreases, followed by a second stage during which the voltage level on the word line settles to a more constant voltage value. The first stage can be followed by subsequent stages. Each of the stages is associated with a timing parameter that defines a duration of the stage.

The operating temperature of the memory 110 impacts the number of programming pulses that may be used to program a memory cell. At lower temperatures a greater number of programming pulses are used during a write operation; whereas in contrast, a fewer number of programming pulses are used at higher temperatures. Furthermore, the greater the number of programming pulses, the greater the number of verify cycles.

As shown in the plot 508, when memory cells are programmed at lower temperatures (e.g., illustrated by low temperature line 507), the number of verify cycles is greater than when memory cells are programmed at higher temperatures (e.g., illustrated by high temperature line 509). The increased number of verify cycles—performed on memory cells programmed at lower temperatures—results in an average difference of y microseconds between memory cells programmed at lower temperatures and higher temperatures, where the memory cells at lower temperatures take longer to program. In one example, an average difference (e.g., value of y) is around 50 microseconds.

The difference in the number of programming pulses is due to a distribution of the natural threshold voltages of the memory cells at high temperatures versus at low temperatures. The plot 510 illustrates—in terms of the 5 sigma value—a distribution of the natural threshold voltages of the various memory cells at higher (e.g., high temperature line 512) and lower temperatures (e.g., low temperature line 514). At higher temperatures (e.g., high temperature line 512), a distribution of the natural threshold voltages of the memory cells is narrower than at lower temperatures (e.g., low temperature line 514). That is, as threshold voltage is higher in the metal-oxide semiconductor field effect transistor (MOSFET) at lower temperatures, the natural threshold voltages of the memory cells are a lot more varied or wider than at lower temperatures. At higher temperatures, due to decreased threshold voltage, the natural threshold voltages of the memory cells are closer to each other.

In plot 502, low temperature distribution line 504 illustrates a distribution of the time to program a plurality of memory cells at lower temperatures, and high temperature distribution line 506 illustrates a distribution of time to program a plurality of memory cells at high temperatures. The low temperature distribution line 504 falls to the right of high temperature distribution line 506, and illustrates a phenomenon encountered in many embodiments, wherein the controller 104 takes longer to program memory cells at lower temperatures than at higher temperatures. As illustrated in plot 502, a difference in time taken to program memory cells between lower and higher temperatures is $\Delta t$. Specifically, as illustrated in plot 502, it can take about $\Delta t$ time units longer to program a memory cell at lower temperatures than at higher temperatures. In one example, $\Delta t$ is around 62 microseconds. The longer programming time is attributable to having to use a greater number of programming pulses at lower temperatures, where a given pulse width—the duration of the pulse—is constant between programming pulses at lower temperatures and programming pulses at higher temperatures.

As the distribution of the natural threshold voltages is wider at lower temperatures, a larger number of pulses may be used to ensure enough charge has been applied to the floating gates of the memory cells. That is, a greater number of pulses may be used when the memory 110 is operating at lower temperatures, to sufficiently program all the memory cells.

Figure 6:
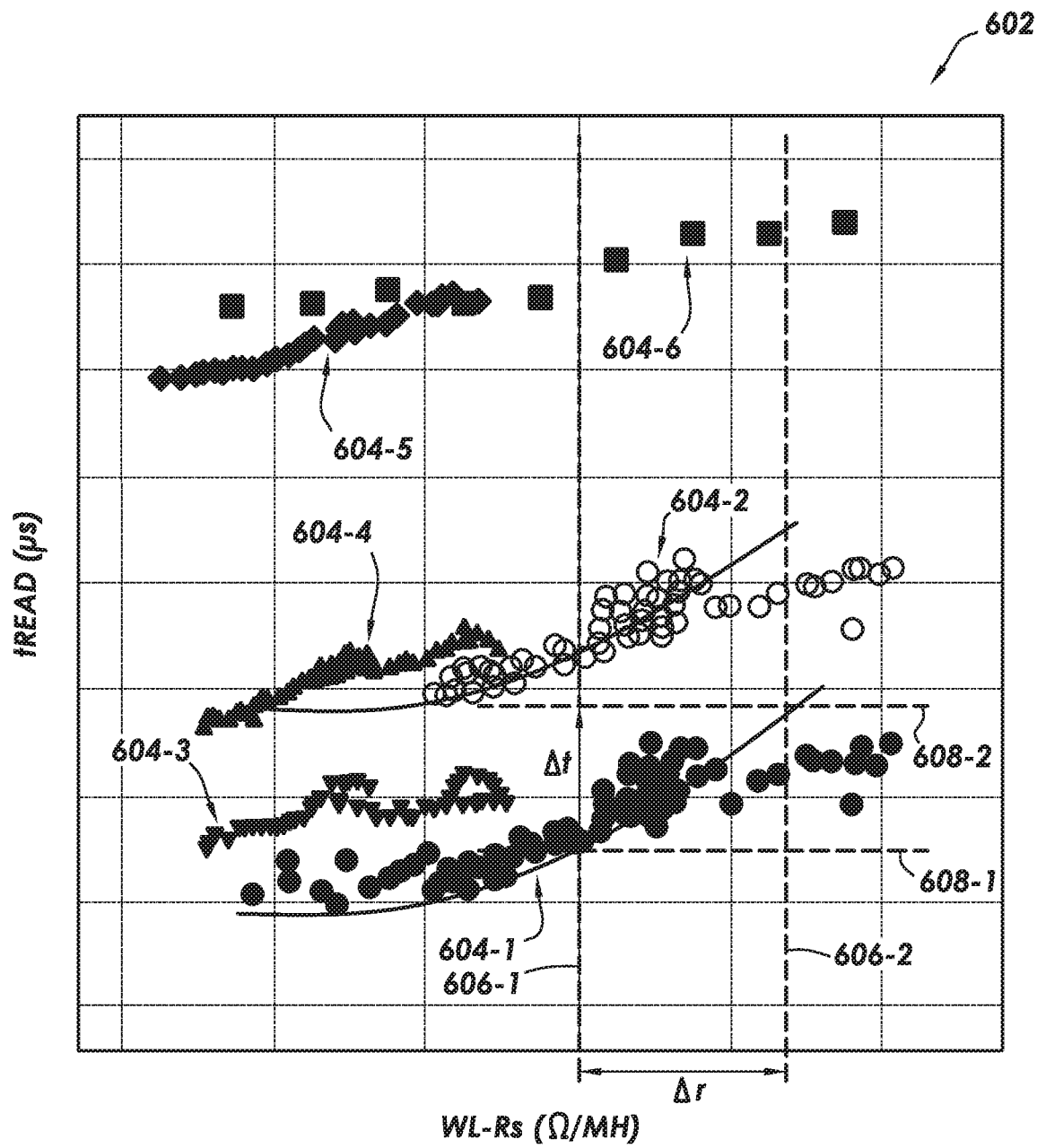
FIG. 6 illustrates a plot demonstrating a relationship between read cycles and word line resistance, in accordance with some embodiments.

FIG. 6 illustrates another distribution plot 602 including distribution lines 604 that illustrate a relationship between $t_{READ}$ times and a resistance of a given word line. The $t_{READ}$ time is associated with a duration of a verify cycle. The example distribution line 604-1 is associated with the data shown in FIGS. 5A and 5B. Values associated with a word line resistance having the units Ω/MH (Ohm per memory hole pitch) is shown along the x-axis of the plot 602, while a time associated with performing a successful $t_{READ}$ in microseconds is shown along the y-axis. As shown in the plot 602, for a difference in resistance $\Delta r$, the time to successfully perform a $t_{READ}$ can be decreased by about $\Delta t$ microseconds. In particular, $\Delta r$ is defined between dashed lines 606-1 and 606-2, while $\Delta t$, is defined between dashed lines 608-1 and 608-2. The decrease in duration of the verify cycle by $\Delta t$ can alternatively be described as a reduction in the duration of the verify cycle.

In one example, a difference in resistance from 12 Ω/MH to 10 Ω/MH can result in a time difference of about 2.92 microseconds. However, various known methods used to program a memory use the same verify cycle parameters at higher and lower temperatures. Thus, the benefits of performing a verify cycle with a shorter duration, at lower temperatures is not realized.

Figure 7A:
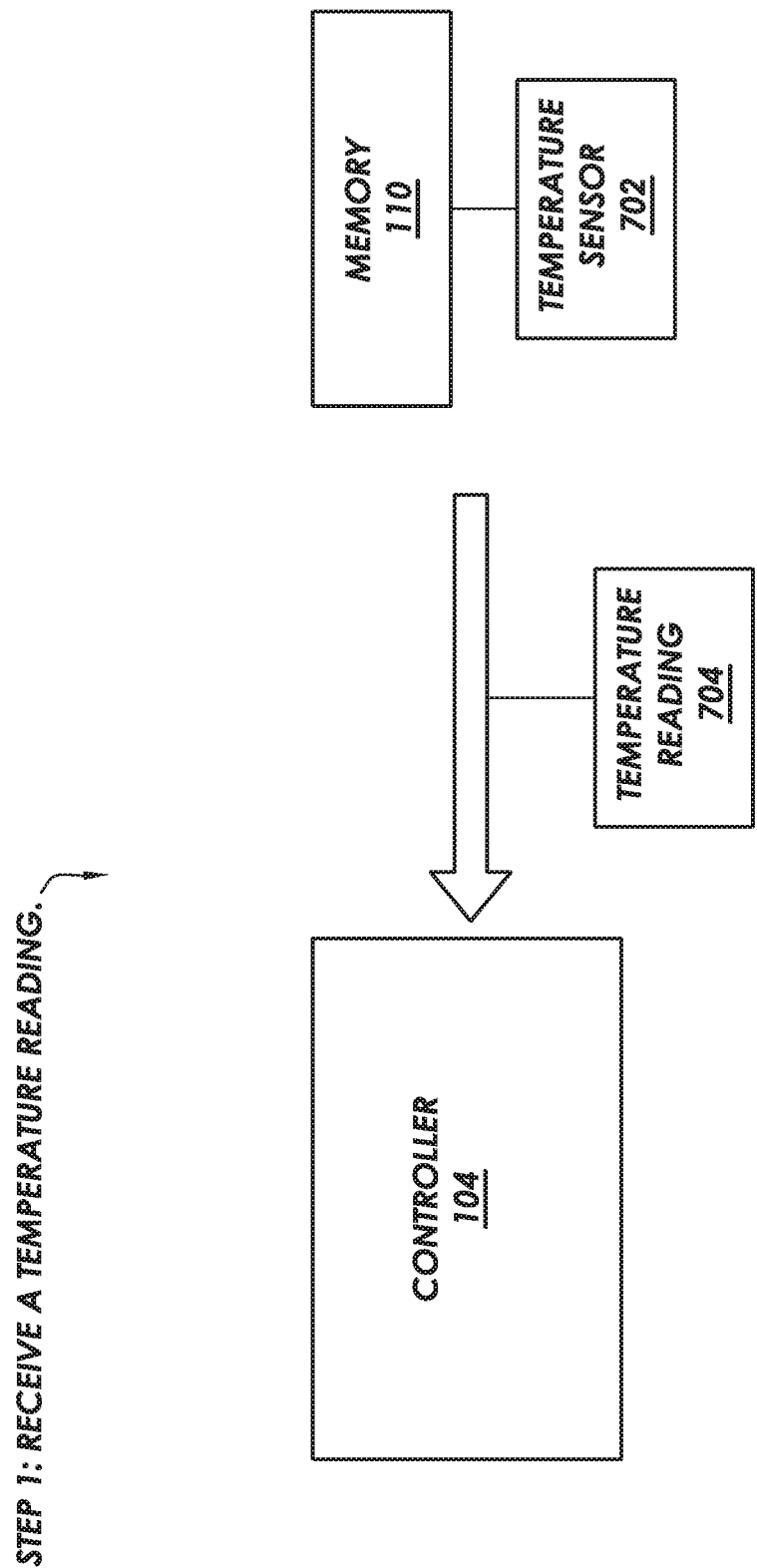
FIG. 7A illustrates a conceptual and method diagram in which the controller performs a programming cycle based on a temperature reading, in accordance with some embodiments.
Figure 7B:
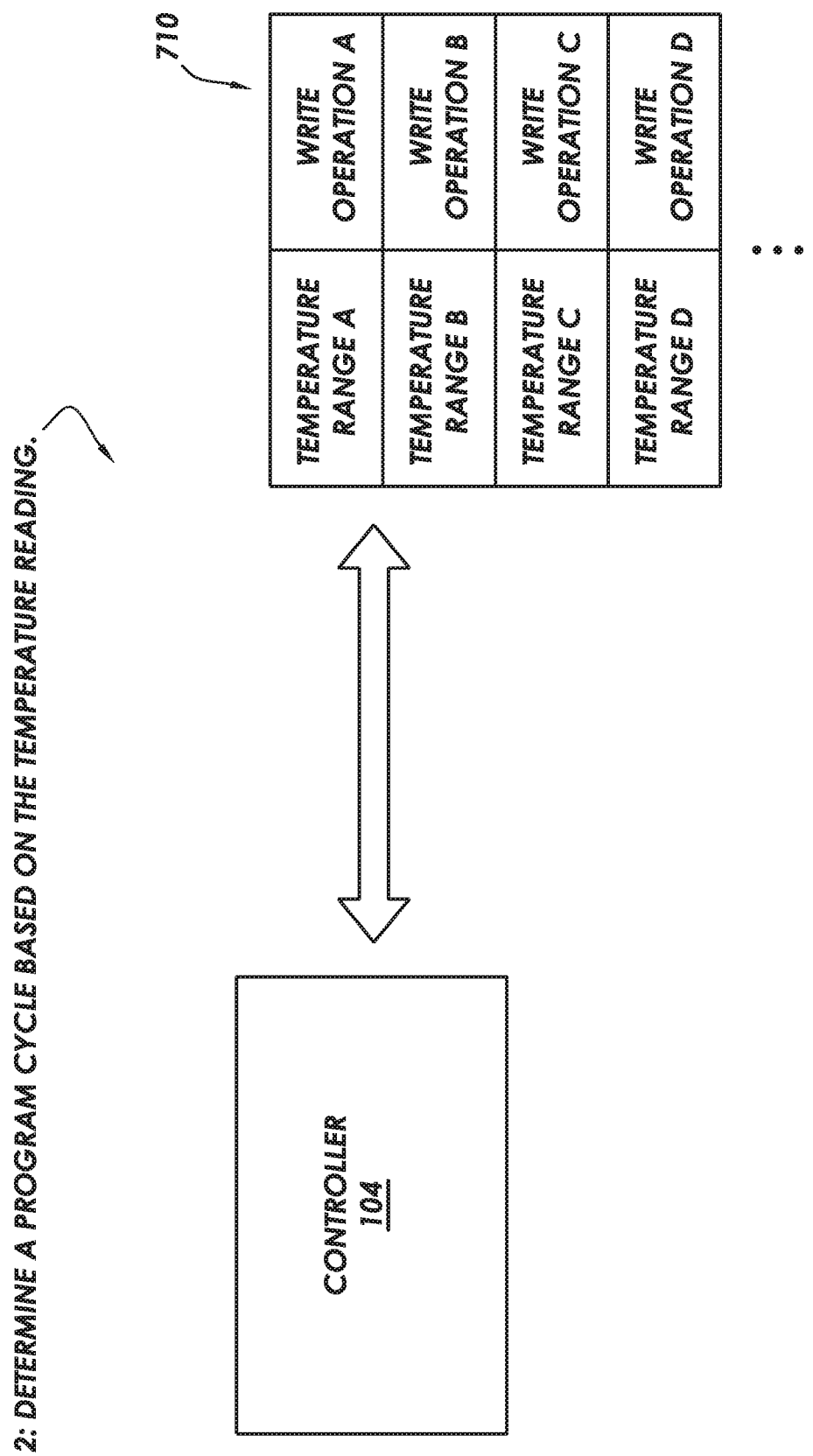
FIG. 7B illustrates a conceptual and method diagram in which the controller performs a programming cycle based on a temperature reading, in accordance with some embodiments.

FIGS. 7A-7C illustrate a conceptual and method diagram in which a controller dynamically adjusts parameters associated with a write operation based on a received temperature reading. For example, the controller 104 receives a temperature reading 704 of the memory 110 or a portion of the memory 110. The temperature reading 704 includes a temperature value of the memory 110 or a portion of the memory 110. A temperature sensor 702 coupled to or disposed within the memory 110 is configured to obtain the temperature reading 704 and transmit the temperature reading 704 to the memory controller 104. Alternatively, the memory controller 104 is configured to retrieve the temperature reading 704 from the temperature sensor 702.

Various events can cause the temperature sensor 702 to transmit the temperature reading 704 (or alternatively, cause the memory controller 104 to retrieve the temperature reading 704). For example, the temperature sensor 702 can be configured to measure temperature at set time intervals (e.g., every few hundred microseconds). The temperature sensor 702 can also be configured to measure temperature upon a request from the controller 104. The controller 104 can send the request for various reasons including but not limited to: initiating a write operation; initiating a read operation; performing a garbage collection operation; performing an operation that alters data within the memory; in response to a failed bit count meeting a threshold value; in response to a number of uncorrectable errors meeting a threshold value; and upon startup of the memory 110.

In FIG. 7B, the controller 104 determines parameters for a write operation based on the temperature reading (step 2). As described herein, the resistance of a word line decreases as the temperature decreases. Accordingly, at lower temperatures, voltages take less time to settle in the memory. Embodiments herein utilize this phenomenon to reduce a duration of a write operation when writing data to memory cells at lower temperatures.

The duration of the write operation is reduced by modifying the clock timings associated with a verify cycle. In additional embodiments, the duration of the write operation is further reduced by modifying the time for ramp up during a programming cycle. The modified clock timings can be implemented with additional granularity. For example, clock timings associated with a verify cycle may be slightly reduced for temperature ranges closer to higher temperatures (e.g., 120 degrees Celsius), while clock timings may be more greatly reduced for temperature ranges closer to the lower temperatures (e.g., −40 degrees Celsius). That is, at high temperatures, the clock timings will be the largest, and as an operating temperature of the memory decreases, associated clock timings will decrease. The decrease in clock timings can occur incrementally, as described next. In one embodiment, each set of clock timings are associated with a specific range of temperatures. Example temperature ranges can include temperatures within ten to twenty degrees of each other. And each of the temperature ranges are respectively associated with a write operation where clock timings for the verify cycle are modified to account for different resistance values of a word line at the respective temperature ranges.

In one example, the clock timings associated with a verify cycle are reduced incrementally, where a first temperature range A includes temperatures within ten degrees of each other (e.g., 110-120 degrees Celsius). The controller 104 uses a first set of clock timings associated with a write operation A when programming memory cells that fall within the first temperature range A. For a different range of temperatures (e.g., temperature range B including 100 to 109 degrees Celsius), the controller 104 uses a second set of clock timings associated with a write operation B. The first set of clock timings having a longer duration (e.g., width associated with either a ramp-up time or ramp-down time), than the second set of clock timing, and thus the write operation A may take longer than or the same time as the write operation B.

Recall that prior to implementing the various techniques described herein, the duration of performing a write operation at higher temperatures was shorter than performing a write operation at lower temperatures (e.g., due to using a larger number of pulses when operating at lower temperatures). The above example demonstrates that by implementing the techniques described herein, due to the second set of clock timings, the resulting duration of performing a write operation at lower temperatures can be shorter than or the same as the duration of performing write operations at higher temperatures.

In various embodiments, the temperature ranges and associated modified write operations are stored in a table 710. In various embodiments, the controller 104 accesses the table 710 in RAM 230 or a portion of the memory 110, to determine the write operation to use based on the temperature reading 704.

Accordingly, various implementations are possible given the data in table 710. Furthermore, although modifications of clock timings have been described in relation to the verify cycle that is part of a write operation, the controller 104 can also modify clock timings associated with a read operation based on a temperature of the memory 110. For example, the controller 104 can perform a read operation on the memory 110, and modify a clock timing associated with the read operation based on the temperature value. The controller 104 can base the clock timing based on a received temperature reading of the memory 110. Additionally, modifications of clock timings associated with a programming cycle can also be based on the techniques described herein. For example, the ramp-up and ramp-down times of a programming cycle can be shortened at lower temperatures leading to an overall shorter duration of the programming cycle at lower temperatures.

In FIG. 7C, the controller 104 programs a first data 712 using the determined write operation. The controller 104 may modify a write operation in response to receiving a temperature reading that falls outside of the program cycle's associated temperature range A. For example, if controller 104 receives a temperature reading of 80 degrees Celsius, the controller 104 modifies the write operation it uses to program data to a write operation associated with a temperature range that includes 80 degrees Celsius. In other embodiments, the controller 104 schedules data to be written in to the memory 110 and as part of that process determines a temperature of the memory 110 and sets the appropriate write operation based on the temperature reading. Thus, the controller 104 can reduce an overall duration of a write operation by leveraging the reduced word line resistance that occurs at lower temperatures.

Figure 8:
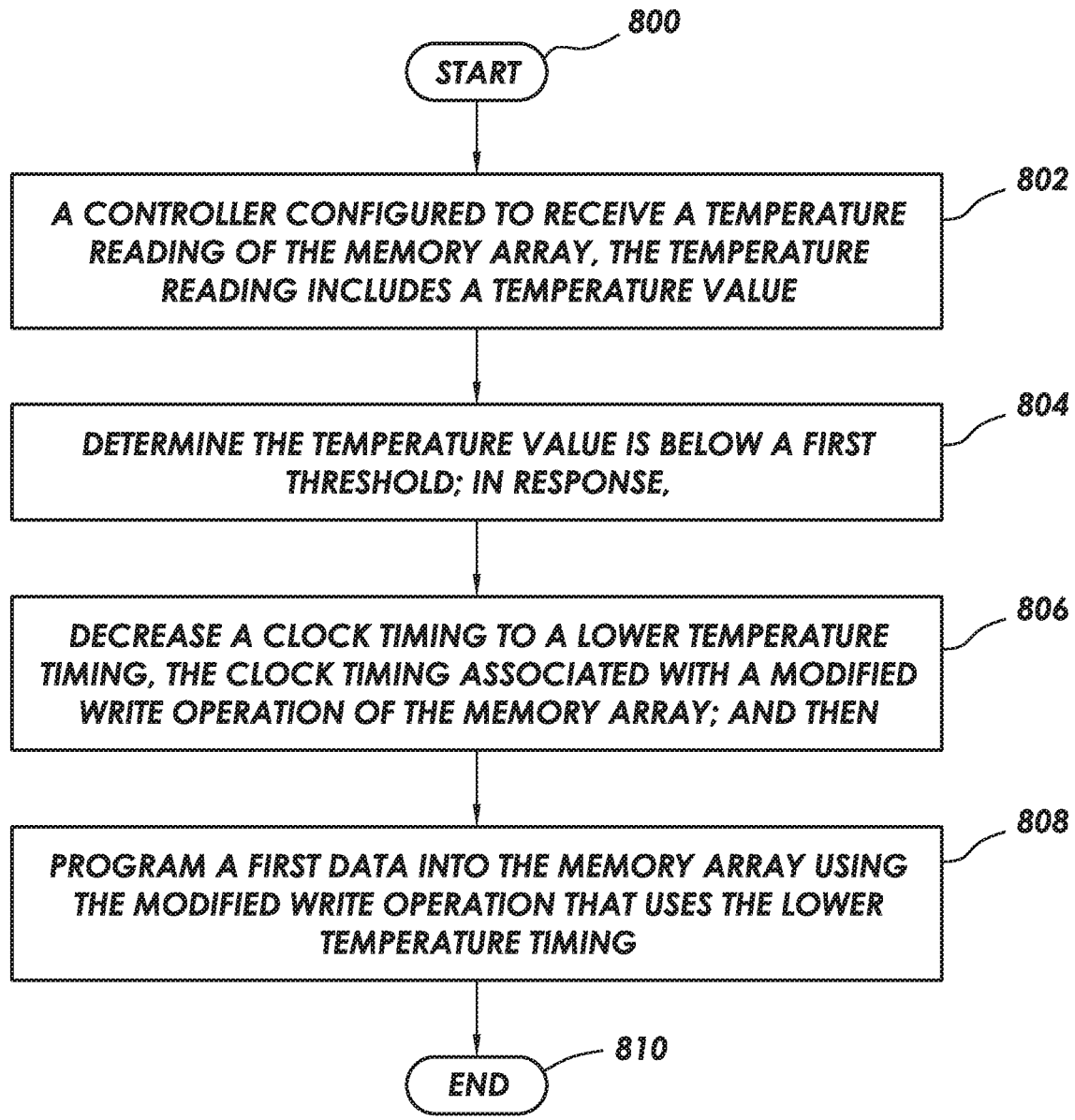
FIG. 8 illustrates a method diagram, in accordance with some embodiments.

FIG. 8 shows a method in accordance with at least some embodiments. In particular, the method is performed at a storage system (e.g., the storage system 102) and includes receiving a temperature reading, where the temperature reading includes a temperature value (block 802). A controller receives the temperature reading from a temperature sensor as described in FIG. 7A. After receiving the temperature reading, the storage system compares the temperature value to a threshold amount (block 804); modifies a duration of a verify cycle to create a modified programming cycle (806); and programs a first data using the modified programming cycle (block 808). The threshold amount is defined by a temperature range (FIG. 7B). Thereafter the storage system determines whether it has reached an end of data to be programmed (decision block 810). If no, the storage system continues programming data using methods described herein (block 802).

For example, the controller 104 can receive a second temperature reading that is above or below the prior received temperature reading. Accordingly the controller 104 can adjust a duration of the verify cycle by either increasing or decreasing a duration of the verify cycle based on the second temperature reading.

In various embodiments, the storage system may not receive a temperature reading each time it programs additional data. In one example, the storage system receives a temperature reading at set time intervals (e.g., every 100 us to 10 s). In this example, the storage system modifies a write operation when a temperature reading is received, and otherwise continues to program using the current write operation until a temperature reading is received that modifies the write operation. If the storage system determines it has reached an end of data to be programmed, thereafter the method ends (block 810).

The above discussion is meant to be illustrative of the principles and various embodiments as described herein. Numerous variations and modifications will become apparent to those skilled in the art once the above disclosure is fully appreciated. For example, although a controller 104 has been described as performing the methods described above, any processor executing software within a host system can perform the methods described above without departing from the scope of this disclosure. In particular, the methods and techniques described herein as performed in the controller, may also be performed in a host. Furthermore, the methods and concepts disclosed herein may be applied to other types of persistent memories other than flash. It is intended that the following claims be interpreted to embrace all such variations and modifications.

What is claimed is:

1. A storage system, configured to modify clock parameters of a write operation, comprising:
   a memory array; and
   a controller coupled to the memory array, wherein the controller is configured to:
   receive a temperature reading of the memory array, the temperature reading includes a temperature value;
   determine the temperature value is below a first threshold; in response,
   decrease a clock timing to a lower temperature timing, the clock timing associated with a write operation of the memory array; and then
   program a first data into the memory array using the write operation that uses the lower temperature timing to decrease a duration of a verify cycle of the write operation.

2. The storage system of claim 1, wherein the controller is further configured to:
   receive a second temperature reading of the memory array, the second temperature reading including a second temperature value, wherein the second temperature value is lower than the temperature value;
   determine the second temperature value is below a second threshold; in response,
   further decrease the clock timing to a second lower temperature timing; and then
   program a second data into the memory array using a write operation that uses the second lower temperature timing.

3. The storage system of claim 2, wherein the temperature value is a first temperature value, and a difference between the first temperature value and the second temperature value is at least ten degrees Celsius.

4. The storage system of claim 1, wherein the controller is further configured to:
   receive a second temperature reading of the memory array, the second temperature reading including a second temperature value, wherein the second temperature value is higher than the temperature value;
   determine the second temperature value is above the first threshold; in response,
   increase the clock timing to a high temperature timing; and then
   program a second data into the memory array using a write operation that uses the high temperature timing.

5. The storage system of claim 4, wherein a duration of programming the second data is longer than a duration of programming the first data.

6. The storage system of claim 1, further comprising:
   performing a read operation; and
   modifying a clock timing associated with the read operation based on the temperature value.

7. The storage system of claim 1, wherein
   the temperature value is a first temperature value that is lower than a second temperature value, and
   a duration of programming the first data is lower than a duration of programming a second data into the memory array at the second temperature value.

8. The storage system of claim 7, wherein a number of programming pulses used to program the first data is greater than a number of programming pulses used to program the second data.

9. A memory controller, comprising:
   a first terminal configured to couple to a memory array, the memory controller configured to:
   receive a temperature reading of the memory array, the temperature reading includes a temperature value;
   determine the temperature value is below a first threshold; in response,
   decrease a clock timing to a lower temperature timing, the clock timing associated with a write operation of the memory array; and then
   program a first data into the memory array using the write operation that uses the lower temperature timing to reduce a duration of a verify cycle of the write operation.

10. The memory controller of claim 9, further configured to:
    receive a second temperature reading of the memory array, the second temperature reading including a second temperature value, wherein the second temperature value is higher than the temperature value;
    determine the second temperature value is above the first threshold; in response,
    increase the clock timing to a high temperature timing; and then
    program a second data into the memory array using a write operation that uses the high temperature timing.

11. The memory controller of claim 10, wherein a duration of programming the second data is longer than a duration of programming the first data.

12. The memory controller of claim 10, wherein a duration of programming the second data is the same as a duration of programming the first data.

13. The memory controller of claim 9, wherein the controller is further configured to:
    receive a second temperature reading of the memory array, the second temperature reading including a second temperature value, wherein the second temperature value is lower than the temperature value;
    determine the second temperature value is below a second threshold; in response,
    further decrease the clock timing to a second lower temperature timing; and then
    program a second data into the memory array using a write operation that uses the second lower temperature timing.

14. The memory controller of claim 13, wherein a duration of programming the second data is less than a duration of programming the first data.

15. The memory controller of claim 13, where the temperature value is a first temperature value, and a difference between the first temperature value and the second temperature value is at least ten degrees Celsius.

16. The memory controller of claim 9, further configured to store a set of clock timings, wherein:
    a respective clock timing of the set of clock timings is associated with a first range of temperature values, and
    another respective clock timing of the set of clock timings is associated with a second range of temperature values.

17. A method for dynamically adjusting clock parameters of a write operation, comprising:
    receiving, by a controller, a temperature reading of a memory array, the temperature reading includes a temperature value;
    determining the temperature value is below a first threshold; in response,
    reducing a duration of a verify cycle of a write operation to create a modified verify cycle; and then programming a first data into the memory array using the write operation that uses the modified verify cycle.

18. The method of claim 17, further comprising, prior to programming the first data into the memory array, modifying a duration of a programming cycle of the write operation based on the temperature value to create a modified programming cycle.

19. The method of claim 17, further comprising:

receiving a second temperature reading of the memory array, the second temperature reading includes a second temperature value, wherein the second temperature value is lower than the temperature value;

determining the second temperature value is below a second threshold; in response, decreasing the duration of a verify cycle of a write operation to create a second verify cycle, wherein the second verify cycle is shorter than the modified verify cycle; and then programming a second data into the memory array using the write operation that uses the second verify cycle.

* * * * *